United States Patent [19]
Kingsley et al.

[11] Patent Number: 6,075,418
[45] Date of Patent: Jun. 13, 2000

[54] SYSTEM WITH DOWNSTREAM SET OR CLEAR FOR MEASURING SIGNAL PROPAGATION DELAYS ON INTEGRATED CIRCUITS

[75] Inventors: Christopher H. Kingsley, San Jose; Robert W. Wells, Cupertino; Robert D. Patrie, Scotts Valley, all of Calif.

[73] Assignee: Xilinx, Inc., San Jose, Calif.

[21] Appl. No.: 09/235,419

[22] Filed: Jan. 20, 1999

Related U.S. Application Data

[63] Continuation-in-part of application No. 09/115,204, Jul. 14, 1998, which is a continuation-in-part of application No. 08/710,465, Sep. 17, 1996, Pat. No. 5,790,479.
[60] Provisional application No. 60/107,765, Nov. 9, 1998.
[51] Int. Cl.[7] .................... G04F 10/02; H03B 5/02
[52] U.S. Cl. .............. 331/57; 327/265; 331/DIG. 3; 368/118; 368/120
[58] Field of Search ................. 331/57, DIG. 3; 327/265; 368/118, 120

[56] References Cited

U.S. PATENT DOCUMENTS

| | | | |
|---|---|---|---|
| Re. 34,363 | 8/1993 | Freeman | 307/465 |
| 3,603,746 | 9/1971 | Helck et al. | 179/175.2 |
| 4,510,429 | 4/1985 | Squire | 318/696 |
| 4,792,932 | 12/1988 | Bowhers et al. | 368/113 |
| 4,795,964 | 1/1989 | Mahan-Shitti et al. | 324/60 C |
| 4,878,209 | 10/1989 | Bassett et al. | 368/113 |
| 4,890,270 | 12/1989 | Griffith | 368/113 |
| 5,048,064 | 9/1991 | Rutherford | 377/20 |
| 5,083,299 | 1/1992 | Schwanke et al. | 368/113 |
| 5,181,191 | 1/1993 | Farwell | 368/113 |
| 5,294,559 | 3/1994 | Malhi | 437/40 |
| 5,581,738 | 12/1996 | Dombrowski | 395/500 |
| 5,606,567 | 2/1997 | Agrawal et al. | 371/22.4 |
| 5,625,288 | 4/1997 | Snyder et al. | 324/158.1 |
| 5,845,233 | 12/1998 | Fishburn | 702/108 |
| 5,923,676 | 7/1999 | Sunter et al. | 371/22.5 |

OTHER PUBLICATIONS

"Signal Delay in RC Tree Networks," IEEE Transactions on Computer–Aided Design, vol. CAD–2, No. 3, Jul. 1983, pp. 202–211.

Application Note from Xilinx, Inc., "Efficient Shift Registers, LFSR Counters, and Long Pseudo–Random Sequence Generators," by Peter Alfke, Jul. 7, 1996.

"The Programmable Logic Data Book", 1998, available from Xilinx, Inc., 2100 Logic Drive, San Jose, California 95124, pp. 4–5 to 4–40.

*Primary Examiner*—Siegfried H. Grimm
*Attorney, Agent, or Firm*—Edel M. Young; Arthur J. Behiel, Esq.

[57] ABSTRACT

A circuit separately measures a selected one of the rising-edge and falling-edge signal propagation delays through one or more circuits of interest. A number of synchronous components are configured in a loop so that they together form a free-running ring oscillator. Each synchronous component clocks a subsequent synchronous component in the ring; the subsequent synchronous component responds by clocking a later component in the ring and by clearing a previous component to prepare it for a subsequent clock. The oscillator thus produces an oscillating test signal in which the period is proportional to the clock-to-out delays of synchronous components. This proportionality provides an effective means for measuring the clock-to-out delays of those components. Other embodiments include additional asynchronous test circuit paths for which the associated signal propagation delays are of interest.

21 Claims, 5 Drawing Sheets

SYSTEM WITH DOWNSTREAM SET OR CLEAR FOR MEASURING SIGNAL PROPAGATION DELAYS ON INTEGRATED CIRCUITS

CROSS REFERENCE TO RELATED APPLICATIONS

This applicatioy completes provisional application Ser. No. 60/107,765, filed Nov. 9, 1998 and is a continuation-in-part of U.S. patent application Ser. No. 09/115,204, entitled "Built-In Self Test Method For Measuring Clock To Out Delays," by Robert W. Wells, Robert D. Patrie, and Robert O. Conn, filed Jul. 14, 1998, which is a continuation-in-part of U.S. application Ser. No. 08/710,465, U.S. Pat. No. 5,790,479 filed Sep. 17, 1996 and issued Aug. 4, 1998. This application is also related to:

I. U.S. patent application Ser. No. 09/083,892, entitled "Method For Characterizing Interconnect Timing Characteristics," by Robert O. Conn, filed May 21, 1998;

II. U.S. patent application Ser. No. 09/115,138, entitled "Method and Circuit for Measuring Signal Propagation Delays Using the Duty Cycle of a Ring Oscillator," by Christopher H. Kingsley, Robert W. Wells, and Robert D. Patrie, filed Jul. 14, 1998; and III. U.S. patent application Ser. No. 09/114,369, entitled "Method and System for Measuring Signal Propagation Delays Using Ring Oscillators," by Robert W. Wells, Robert D. Patrie, et al., filed Jul. 14, 1998.

The above documents are incorporated herein by reference.

FIELD OF THE INVENTION

This invention relates generally to methods and circuit configurations for measuring signal propagation delays, and in particular for measuring signal propagation delays through data paths of integrated circuits.

BACKGROUND

Integrated circuits (ICs) are the cornerstones of myriad computational systems, such as personal computers and communications networks. Purchasers of such systems have come to expect significant improvements in speed performance over time. The demand for speed encourages system designers to select ICs that boast superior speed performance. This leads IC manufactures to carefully test the speed performance of their designs.

Figure 1:
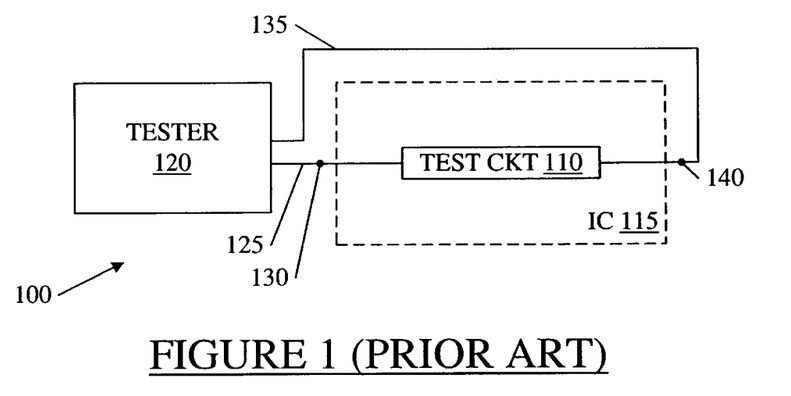
FIG. 1 depicts a conventional test configuration 100 for determining the signal propagation delay of a test circuit 110 in a conventional IC 115.

FIG. 1 depicts a conventional test configuration 100 for determining the signal propagation delay of a test circuit 110 in a conventional IC 115. A tester 120 includes an output lead 125 connected to an input pin 130 of IC 115. Tester 120 also includes an input line 135 connected to an output pin 140 of IC 115.

Tester 120 applies an input signal to input pin 130 and measures how long the signal takes to propagate through test circuit 110 from input pin 130 to output pin 140. The resulting time period is the timing parameter for test circuit 110, the path of interest. Such parameters are typically published in literature associated with particular ICs and/or used to model the speed performance of circuit designs that employ the path of interest.

Conventional test procedures are problematic for at least two reasons. First, many signal paths within a given IC are not directly accessible via input and output pins, and therefore cannot be measured directly. Second, testers have tolerances that can have a significant impact on some measurements, particularly when the path of interest is short. For example, if a tester accurate to one nanosecond measures a propagation delay of one nanosecond, the actual propagation delay might be any time between zero and two nanoseconds. In such a case the IC manufacturer would have to assume the timing parameter was two nanoseconds, the worst-case scenario. If ICs are not assigned worst-case values, some designs will fail. Thus, IC manufacturers tend to add relatively large margins of error, or "guard bands," to ensure that their circuits will perform as advertised. Unfortunately, this means that those manufacturers will not be able to guarantee their full speed performance, which could cost them customers in an industry where speed performance is paramount.

Programmable logic devices (PLDs) are a well-known type of digital integrated circuit that may be programmed by a user (e.g., a circuit designer) to perform specified logic functions. One type of PLD, the field-programmable gate array (FPGA), typically includes an array of configurable logic blocks (CLBs) that are programmably interconnected to each other and to programmable input/output blocks (IOBs). This collection of configurable logic is configured by loading configuration data into internal configuration memory cells that define how the CLBs, interconnections, and IOBs are configured.

Each programming point, CLB, interconnection line, and IOB introduces some delay into a signal path. The many potential combinations of delay-inducing elements make timing predictions particularly difficult. FPGA designers use "speed files" that include resistance and capacitance values for the various delay-inducing elements and combine them to establish delays for desired signal paths. These delays are then used to predict circuit timing for selected circuit designs implemented as FPGA configurations. FPGA timing parameters are assigned worst-case values to ensure FPGA designs work as indicated.

Manufacturers of ICs, including FPGA, would like to guarantee the highest speed performance possible without causing ICs to fail to meet the guaranteed timing specifications. More accurate measurements of circuit timing allow IC designers to use smaller guard bands to ensure correct device performance, and therefore to guarantee higher speed performance. There is therefore a need for a more accurate means of characterizing IC speed performance.

SUMMARY

The present invention gives an accurate means of measuring IC speed performance. The inventive circuit is particularly useful for testing programmable logic devices, which can be programmed to include a device for testing a majority of the requisite test circuitry.

In accordance with the invention, a number of synchronous components are configured in a loop so that they together form a free-running ring oscillator. Each synchronous component clocks a subsequent synchronous component in the ring; the subsequent synchronous component responds by clocking the next component in the ring and by clearing the previous component to prepare it for a subsequent clock. The oscillator thus produces an oscillating test signal in which the period includes the clock-to-out delays of the synchronous components as well as other delays of associated with the circuit configuration. This combination provides an effective means for measuring the clock-to-out delays of synchronous components.

Synchronous components can exhibit different propagation delays depending upon whether they are configured to clock in response to rising or falling edges. The present invention addresses this problem by separately measuring the clock-to-out delays associated with rising and falling edges. The worst-case delay associated with a given component can then be expressed as the longer of the two. Knowing the precise worst-case delay allows IC designers to minimize the guard band and consequently guarantee higher speed performance.

Clock-to-out delays are not the only propagation delays of interest. Various other type of synchronous and asynchronous signal paths should also be characterized to produce speed files that may be employed to accurately predict IC speed performance. One embodiment thus includes one or more test circuits inserted within the ring oscillator. These test circuits increase the period of the oscillator by the delay that they impose. If delays associated with the synchronous components are well characterized, as by using the techniques described above to determine clock-to-out delays, then the known clock-to-out delays can be subtracted from the oscillation period to determine the delay associated with other circuits.

DETAILED DESCRIPTION

Figure 2:
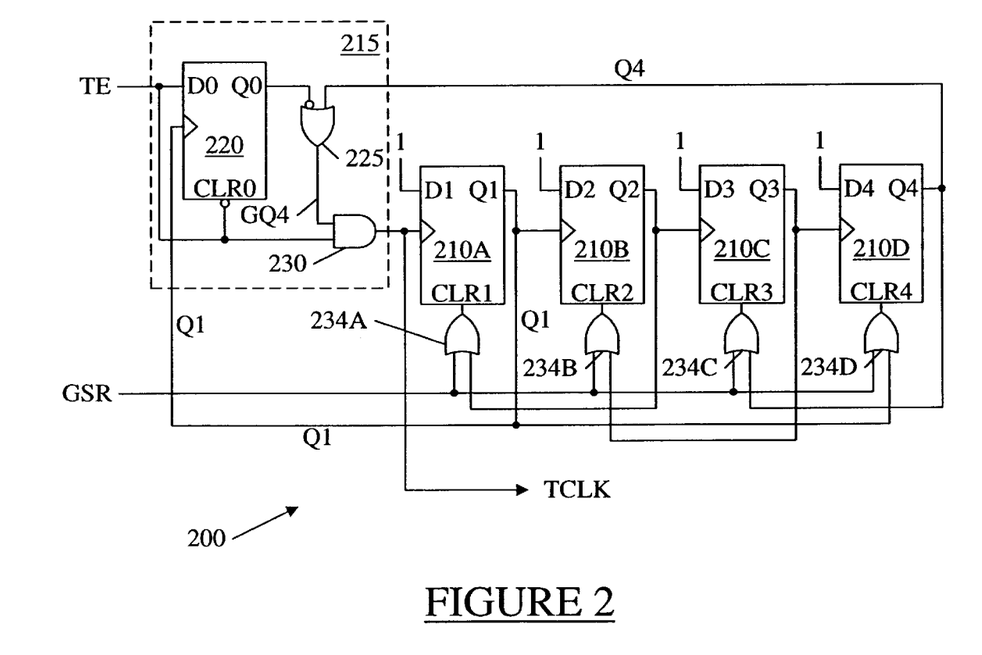
FIG. 2 is a schematic diagram of an oscillator 200 configured to produce a test-clock signal TCLK for which the period TTCLK includes the clock-to-out delays of flip-flops 210A–210D.

FIG. 2 is a schematic diagram of an oscillator 200. In accordance with the invention, the depicted configuration produces an oscillating test signal having a period including the clock-to-out delays of four synchronous components, flip-flops 210A–210D. Other embodiments include additional signal paths for which the associated signal propagation delays are of interest. Examples of such embodiments are described below in connection with FIGS. 6 and 7.

Oscillator 200 includes an oscillator-enable circuit 215 connected to the clock input of flip-flop 210A via a test-clock line TCLK. Oscillator-enable circuit 215 in turn includes a flip-flop 220, an OR gate 225, and an AND gate 230. As discussed below in connection with FIG. 3, oscillator-enable circuit 215 produces an edge on test-clock line TCLK when test-enable line TE is brought high. The rising edge causes oscillator 200 to begin oscillating. Returning test-enable line TE to a logic zero turns oscillator 200 off.

A test-enable signal TE connects to a synchronous input terminal D0 of flip-flop 220, inverted to an asynchronous input terminal CLR0 of flip-flop 220, and to an input terminal of AND gate 230. Global set/reset signal GSR connects to the clear inputs CLR1–CLR4 of flip-flops 210A–210D via respective OR gates 234A–234D. An output terminal Q0 of flip-flop 220 connects to an input of OR gate 225. The output terminal of OR gate 225 connects to the remaining input terminal of AND gate 230 via a line GQ4. Oscillator-enable circuit 215 also includes a pair of input lines Q1 and Q4 from respective flip-flops 210A and 210D: line Q1 connects to the clock input of flip-flop 220; line Q4 connects to the second input terminal of OR gate 225.

The "Q" output terminal of each flip-flop 210A–210D is connected to:

the clock terminal (conventionally designated using a ">" symbol) of a subsequent flip-flop, and an asynchronous clear terminal of a previous flip-flop via a respective OR gate.

For example, output terminal Q2 of flip-flop 210B connects to both the clock terminal of flip-flop 210C and, through OR gate 234A, the asynchronous clear terminal CLR1 of flip-flop 210A. Each rising edge on any given clock terminal thus propagates through to the subsequent flip-flop; the subsequent flip-flop then clears the preceding flip-flop to prepare the preceding flip-flop for the next rising edge. Each subsequent flip-flop thus acts as a synchronous delay element between the output terminal and the clear terminal of a previous flip-flop. In another embodiment having more than four flip-flops in a chain, this previous flip-flop is not directly adjacent but separated by one or more intervening flip-flops. Output Q4 from flip-flop 210D is connected, through circuit 215, to the clock input terminal of flip-flop 210A so that flip-flops 210A–210D form a ring oscillator that responds to rising clock edges only.

Figure 3:
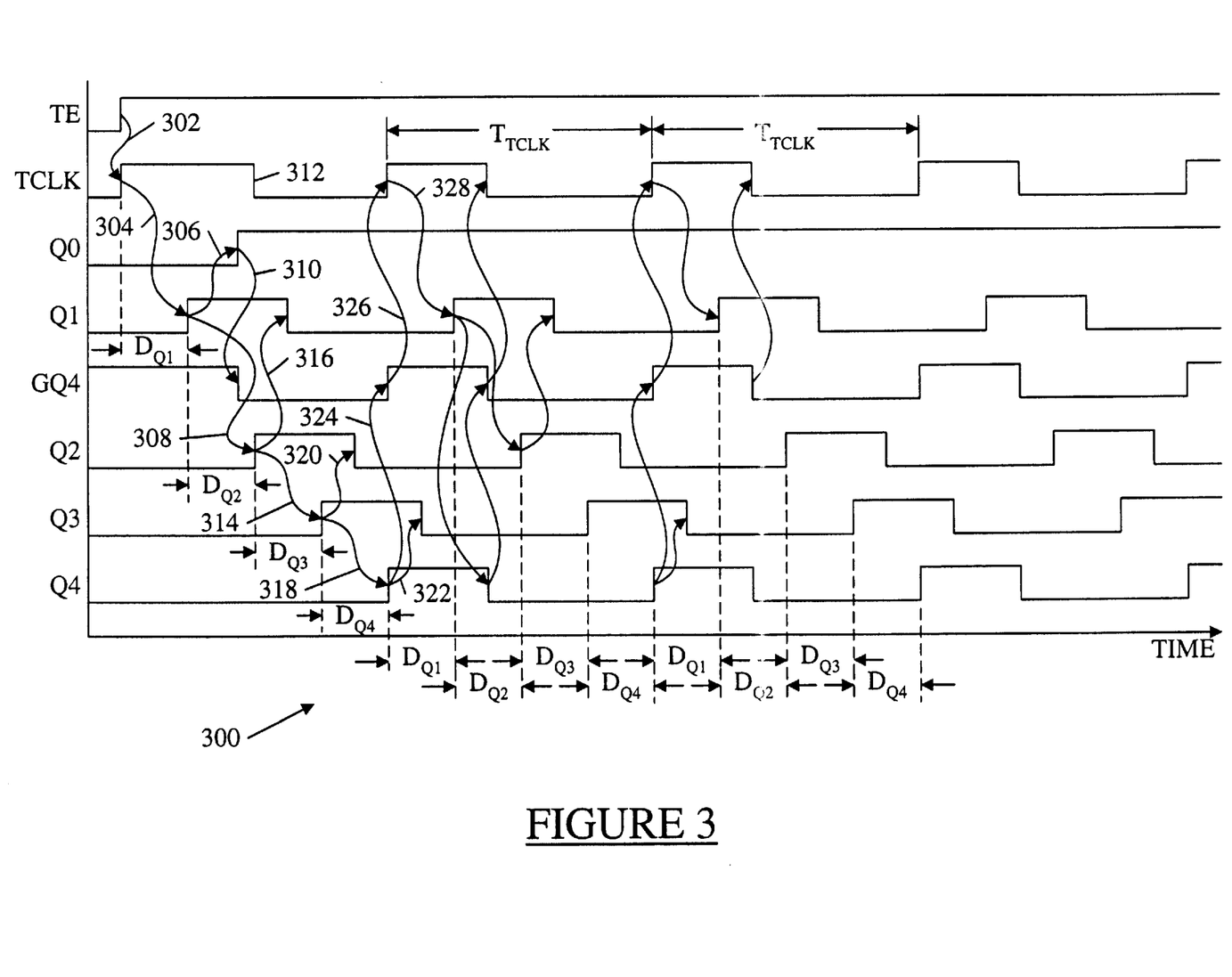
FIG. 3 is a waveform diagram depicting the operation of oscillator 200 of FIG. 2.

FIG. 3 is a waveform diagram 300 depicting the operation of oscillator 200 of FIG. 2. Each waveform in FIG. 3 is labeled using the corresponding node designation depicted in FIG. 2. Lines terminating with differently named input and output nodes are named for output nodes. For example, the line connecting output terminal Q2 of flip-flop 210B to the clock terminal of flip-flop 210C and the clear terminal of flip-flop 210A is labeled "Q2." The node designations are hereafter used to alternatively refer to circuit nodes or their corresponding signals. In each instance, the interpretation of the node designations as either signals or physical elements will be clear from the context.

When global set/reset signal GSR is asserted, all of flip-flops 210A–210D are cleared by the GSR signal so that their respective "Q", outputs are at logic zero. OR gate 225, receiving a logic zero from output Q0, and inverting this signal to a logic one on an input, outputs a logic one on line GQ4.

A test cycle begins after global set/reset signal GSR is deasserted (brought to a logic zero), when test-enable signal TE is asserted (brought to a logic one). Because line GQ4 carries a logic one, AND gate 230 passes the rising edge from test-enable signal TE to test-clock terminal TCLK (arrow 302), and consequently to the clock terminal of flip-flop 210A. The rising edge on the clock terminal of flip-flip 210A clocks flip-flop 210A so that the logic one on input terminal D1 transfers to output terminal Q1 after the clock-to-out delay $D_{Q1}$ associated with flip-flop 210A (arrow 304).

The rising edge of signal Q1 does three things. One, the rising edge of signal Q1 clocks flip-flop 210B so that the logic one on input D2 transfers to output terminal Q2 after the clock-to-out delay $D_{Q2}$ associated with flip-flop 210B (arrow 308). Two, the rising edge of signal Q1 clears flip-flop 210D. Clearing flip-flop 210D has no impact in the first instance of a rising edge on terminal Q1. However, as described below, each subsequent rising edge on test-clock line TCLK occurs when output Q4 of flip-flop 210D goes high; thus flip-flop 210D must be reset (cleared) to prepare TCLK for subsequent rising edges. Three, the rising edge of signal Q1 clocks flip flop 220 so that test enable signal TE (current value=logic 1) is transferred to output terminal Q0 (arrow 306).

The rising edge on line Q0 produces a falling edge on line GQ4 (arrow 310), which in turn produces a falling edge 312 on line TCLK. Flip-flop 210A, a positive-edge-triggered flip-flop, is unaffected by falling edge 312. Falling edge 312 is important, however, because it prepares flip-flop 210A to respond to a subsequent rising clock edge. Line Q0 then remains at logic one for the duration of the test period, or as long as test-enable signal TE is asserted.

The rising edge of signal Q2 clocks flip-flop 210C so that the logic one on input D3 transfers to output Q3 after the clock-to-out delay $D_{Q3}$ associated with flip-flop 210C (arrow 314). The rising edge of signal Q2 also clears flip-flop 210A, returning output terminal Q1 to a logic zero (arrow 316). The resulting rising edge of signal Q3 then clocks flip-flop 210D so that the logic one on input D4 transfers to output Q4 after the clock-to-out delay $D_{Q4}$ associated with flip-flop 210D (arrow 318). The rising edge of signal Q3 also clears flip-flop 210B (arrow 320). Finally, the rising edge on line Q4 clears flip-flop 210C (arrow 322) and propagates through OR gate 225 and AND gate 230 to clock flip-flop 210A once again (arrows 324 and 326). Oscillator 200 then continues to cycle a pulse through flip-flops 210A–210D until test-enable line TE returns to a logic zero, which causes AND gate 230 to block the feedback from flip-flop 210D from clocking flip-flop 210A.

Cycling a pulse through flip-flops 210A–210D produces an oscillating test signal on test-clock terminal TCLK. The period $T_{TCLK}$ of the test signal includes the sum of rising edge clock-to-out delays $D_{Q1}$, $D_{Q2}$, $D_{Q3}$, and $D_{Q4}$.

Figure 4:
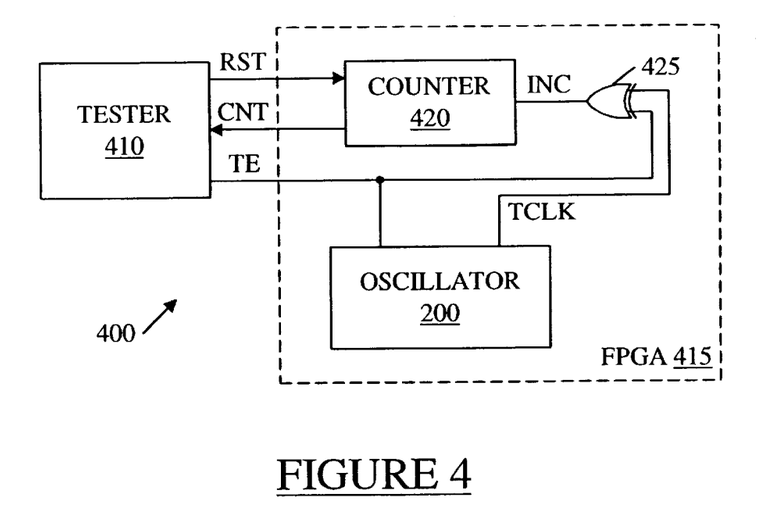
FIG. 4 is a schematic diagram of a system 400 for measuring test-clock period $T_{TCLK}$ of oscillator 200 of FIG. 2.

FIG. 4 is a schematic diagram of a system 400 for measuring test-clock period $T_{TCLK}$ of oscillator 200 of FIG. 2. System 400 includes a conventional tester 410 connected to an FPGA 415. In accordance with the invention, FPGA 415 is configured to include a counter 420, an XOR gate 425, and oscillator 200. System 400 may also be used with other types of oscillators, such as those described below in connection with FIGS. 5 and 6.

Test-clock line TCLK connects to counter 420 via XOR gate 425. Counter 420 is a conventional binary counter adapted to count the number of rising edges on increment line INC from XOR gate 425. Counter 420 connects to tester 410 via a test-count line CNT and a reset line RST. Reset line RST allows tester 410 to reset counter 420 to zero.

Tester 410 defines a test period by asserting test-enable signal TE. Oscillator 200 outputs an oscillating test-clock signal TCLK for as long as test-enable signal TE is asserted, and counter 420 increments for each rising edge of the test-clock signal TCLK. Thus, after test-enable line TE is asserted for the test period, counter 420 will contain the number of oscillations that oscillator 200 generated over the test period. This number is transferred to tester 410 on lines CNT. The number may be transferred either serially or in parallel. Calculating the period $T_{TCLK}$ of oscillator 200 is then a simple matter of dividing the test period by the number of counts stored in counter 420. For example, if test-enable line TE was held high for one second to achieve a count of 1,000, then the oscillation period $T_{TCLK}$ of oscillator 237 is one second divided by 1,000, or 1 millisecond.

System 400 provides a very accurate measure of the delay through oscillator 200 by counting over many cycles. Moreover, the method is relatively inexpensive to implement using FPGAs because FPGAs can be configured to simultaneously include many test circuits and the test circuitry (e.g., oscillator 200 and counter 420) required to test them.

In practice, synchronous components can exhibit different propagation delays depending upon whether they are configured to respond to rising clock edges or falling clock edges. There is therefore a need for a way to determine the clock-to-out delays for synchronous components adapted to respond to falling clock edges.

Figure 5:
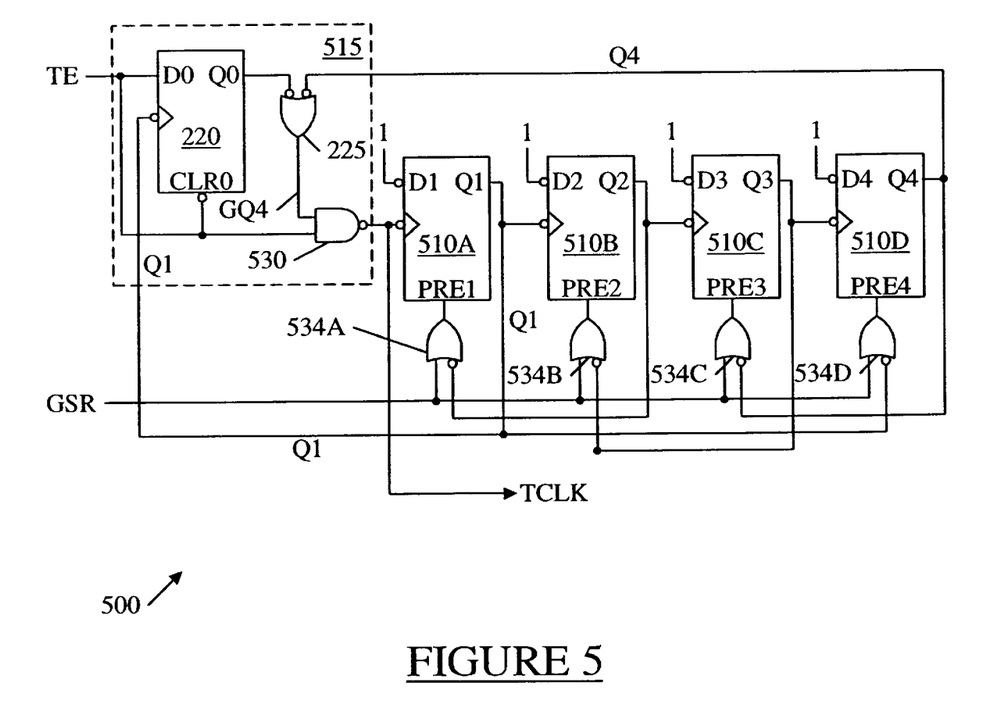
FIG. 5 is a schematic diagram of an oscillator 500 configured to produce a test-clock signal TCLK for which the period $T_{TCLK}$ includes the clock-to-out delays of flip-flops 510A–510D.

FIG. 5 is a schematic diagram of an oscillator 500 configured to produce a test-clock signal TCLK for which the period $T_{TCLK}$ includes the falling-edge clock-to-out delays of flip-flops 510A–510D. Flip-flops 510A–510D are falling-edge triggered, as indicated by the "bubbles" on their respective clock terminals. The operation of oscillator 500 is similar to that of oscillator 200 of FIG. 2, except that the test-clock period $T_{TCLK}$ of oscillator 500 includes the delay associated with falling edges propagating through flip-flops 510A–510D, whereas the test-clock period $T_{TCLK}$ of oscillator 200 includes the delay associated with rising edges propagating through flip-flops 210A–210D. Due to the similarities of oscillators 200 and 500, a detailed description of the operation of oscillator 500 is omitted for brevity.

Flip-flops 510A–510D are similar to flip-flops 210A–210D. However, the respective "D" inputs are inverted, the clock terminals are negative-edge triggered, and instead of having feedback connections to clear inputs as in flip-flops 210A–210D, each of flip-flops 510A–510D has a feedback line connected through inverting inputs of one of OR gates 534A–534D to a respective preset terminal (e.g., output terminal Q2 of flip-flop 510B connects through OR gate 534A to preset terminal PRE1 of flip-flop 510A). Oscillator 500 also includes an oscillator-enable circuit 515 that is similar to oscillator-enable circuit 215, but differs in that the polarities of the clock input terminal of flip-flop 220 and the Q4 input terminal of OR gate 225 are reversed, and AND gate 230 is replaced by a NAND gate 530.

Oscillator 200 of FIG. 2 and oscillator 500 of FIG. 5 can be used to determine, separately, the delays associated with falling and rising edges propagating through flip-flops of the type used to implement flip-flops 210A–210D and 510A–510D. The worst-case delay for such flip-flops can then be expressed as the longer of the two. A timing diagram of oscillator 500 of FIG. 5 would be the same as that shown in in FIG. 3 except that the TCLK and Q1–Q4 waveforms are inverted. Knowing the precise worst-case delay allows IC designers to minimize the guard band and consequently guarantee higher speed performance. In addition, knowing which type of signal transition propagates more slowly allows IC designers to optimize signal paths more efficiently by focusing on those components responsible for the slower performance.

Clock-to-out delays are not the only propagation delay of interest. Various types of propagation delays are also characterized to produce speed files that may be employed to accurately predict IC speed performance. Some embodiments of the invention are therefore adapted to measure the delays associated with asynchronous test circuits.

Figure 6:
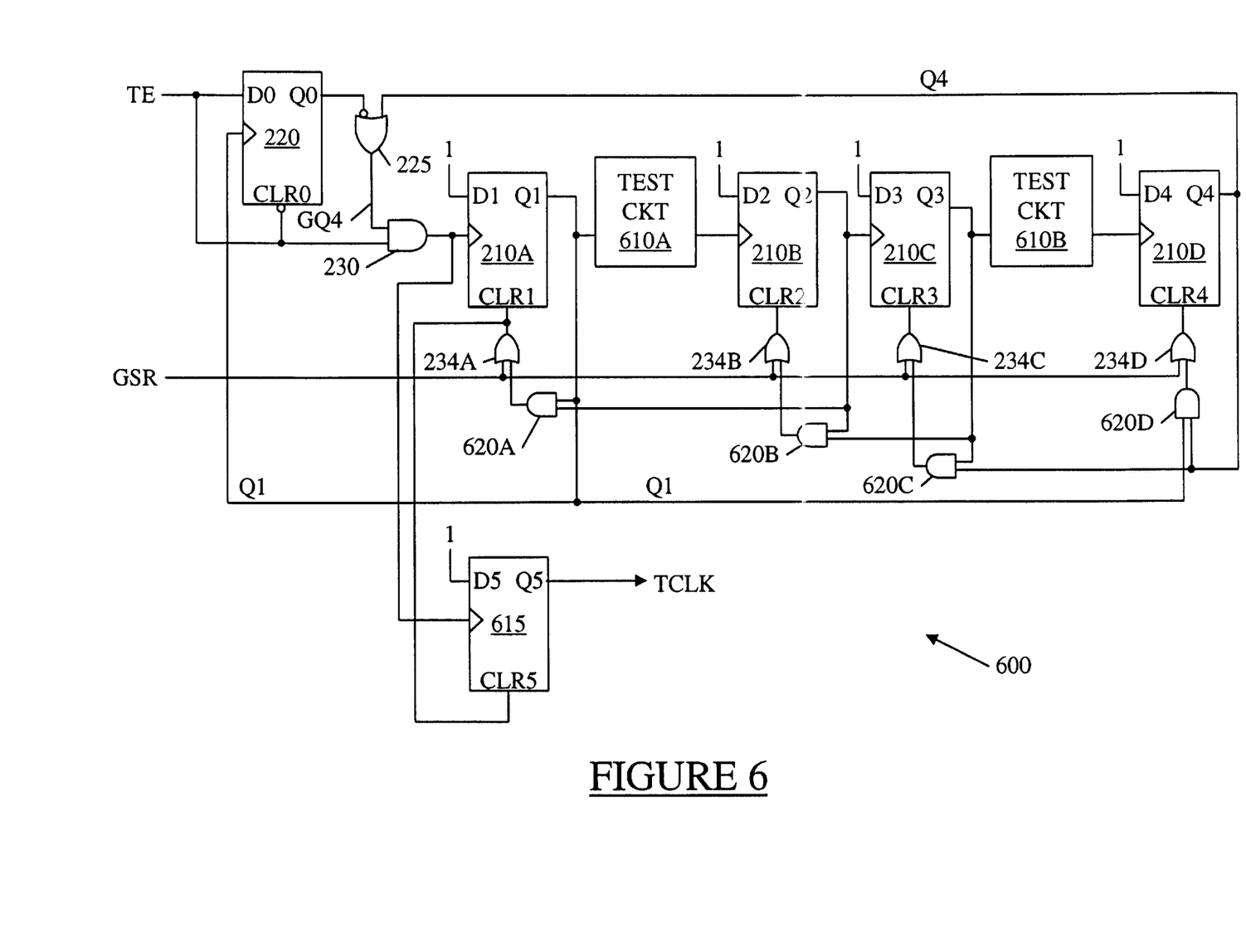
FIG. 6 is a schematic diagram of an oscillator 600 configured to produce a test-clock signal TCLK for which the period $T_{TCLK}$ includes the combined delays of flip-flops 210A–210D and test circuits 610A and 610B.

FIG. 6 is a schematic diagram of an oscillator 600 configured, in accordance with the invention, to include a pair of similar asynchronous test circuits 610A and 610B. Test circuits 610A and 610B might be any signal paths for which the associated signal propagation delays are of interest. In one embodiment, for example, test circuits 610A and 610B are signal paths on an FPGA.

Oscillator 600 is similar to oscillator 200, like-numbered elements being the same. Oscillator 600 additionally includes a flip-flop 615, and four AND gates 620A–620D. Flip-flop 615, identical to flip-flop 210A, minimizes the loading effect of test-clock line TCLK so that the clock-to-out timing of flip-flops 210A–210D is accurately represented by the oscillation period of oscillator 600.

Alternative embodiments that also achieve the goal of reducing loading on AND gate 230 include making flip-flop 615 a toggle flip-flop. (A toggle flip-flop includes an inverter feeding back that flip-flop's Q output to the D input so that the toggle flip-flop changes state each clock period.) A toggle flip-flop would guarantee a 50% duty cycle on test-clock terminal TCLK. Placing a buffer between the output of AND gate 230 and test-clock terminal TCLK also reduces loading on AND gate 230.

As with oscillator 200, the test-clock period $T_{TCLK}$ of test-clock signal TCLK includes the rising-edge delay through flip-flops 210A–210D. However, the addition of test circuits 610A and 610B increases the signal propagation delay through flip-flops 210A–210D so that the total test-clock period $T_{TCLK}$ increases by an amount equal to the combined rising-edge delay $D_R$ of test circuits 610A and 610B.

If a rising edge propagates too quickly through flip-flops 210A–210D, it is possible that the rising edge can arrive to clock one of flip-flops 210A–210D while the clear signal on its clear terminal is still asserted. Such a case could stop oscillator 600 from oscillating. AND gates 620A–620D reduce the likelihood of such a stoppage by reducing the pulse width of the clear signal. Without AND gate 620C, for example, the clear signal CLR3 rises and falls with signal Q4. With AND gate 620C, the clear signal CLR3 still rises with signal Q4, but falls with signal Q3.

The oscillator of FIG. 6 will function correctly without the additional gates 620A–620D provided that the delays in propagating the clear signal to terminals CLR1–CLR4 are small compared to delays through the clock path in flip-flops 210A–210D and through synchronous elements 610A and 610B. For example, for flip-flop 210C to function correctly, the clear delay from a rising edge at terminal Q1 of flip-flop 210A to terminal CLR4 of flip-flop 210D to the resulting falling edge of terminal Q4 to the clear terminal CLR3 of flip-flop 210C must be shorter than the clock path delay from the rising edge at terminal Q1 to asynchronous element 610A to the clock terminal of flip-flop 210B to the rising edge of the Q2 terminal of flip-flop 210B to the rising edge at the clock terminal of flip-flop 210C.

This condition will be satisfied if the propagation path of the clear signal is fast, or if the delay in element 610A is large enough. However, if this condition cannot be satisfied, AND gates 620A–620D create a condition more easily satisfied.

With AND gates 620A–620D in the circuit, as shown in FIG. 6, there is still a constraint on the propagation delays of the clear and clock signals. There would be an incorrect pulse at the clear terminal of flip-flop 210C if the Q4 input to AND gate 620C were still high when the Q3 output of flip-flop 210C goes high. To prevent such a condition, the delay from the rising edge at terminal Q1 of flip-flop 210A to the rising edge of clear terminal CLR4 of flip-flop 210D to the falling edge of output terminal Q4 of flip-flop 210D to the Q4 input terminal of AND gate 620C must be less than:

the delay from the rising edge at terminal Q1 of flip-flop 210A through asynchronous component 610A to the clock terminal of flip-flop 210B to the rising edge at the Q2 output terminal of flip-flop 210B to the rising edge of the clock terminal of flip-flop 210C to the rising edge of the Q3 output terminal of flip-flop 210C to the rising edge of the Q3 input signal to AND gate 620C.

This condition is clearly more easily satisfied than the condition required when AND gate 620C is not present.

Test circuits 610A and 610B represent propagation delays on two portins of the test path. Preferably these two delays are of similar length. Providing a pair of test circuits in the depicted configuration produces a more balanced test-clock waveform, helping to ensure that one edge of test-clock signal TCLK does not overtake the other.

Figure 7:
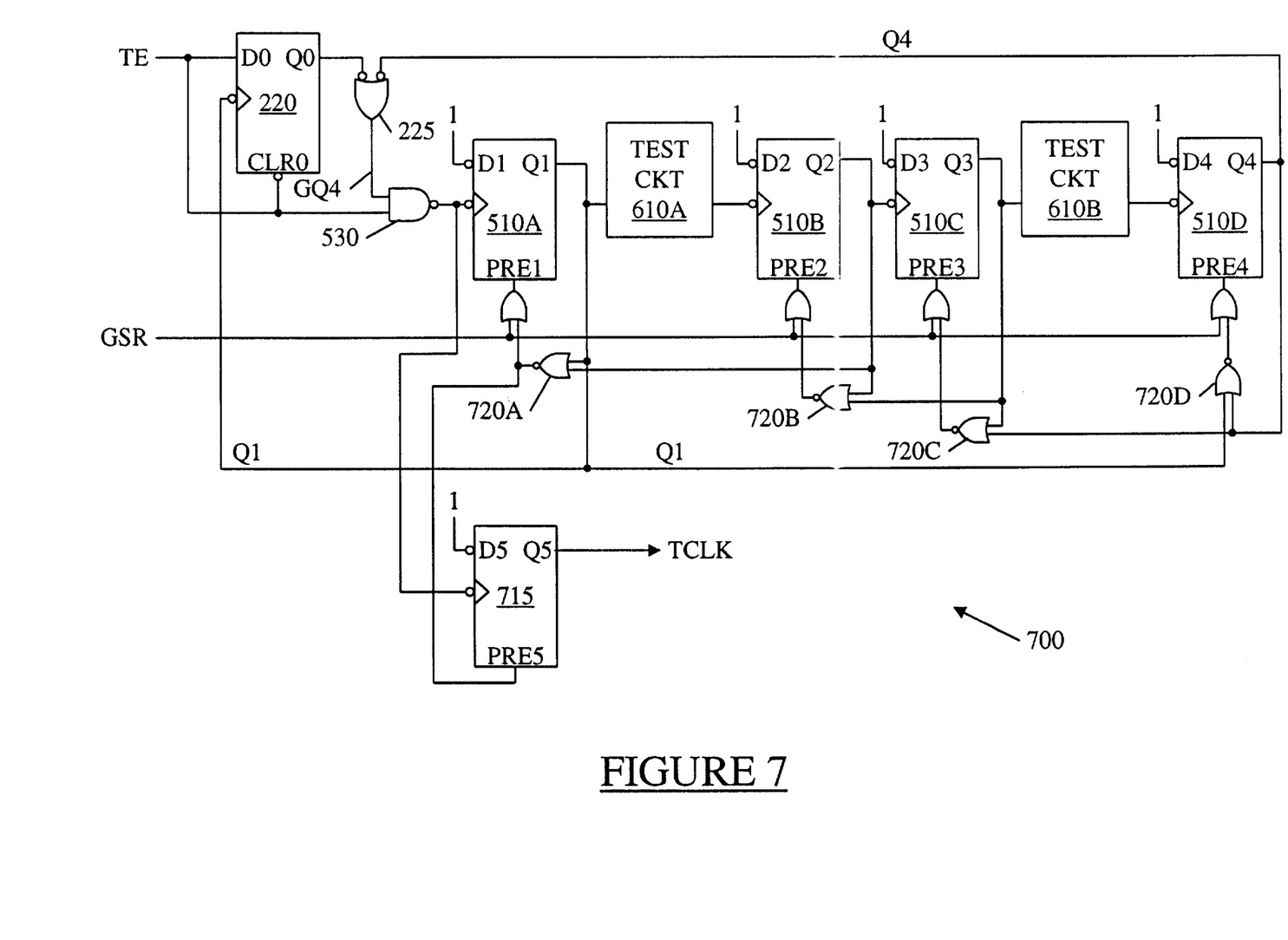
FIG. 7 is a schematic diagram of an oscillator 700 configured to produce a test-clock signal TCLK for which the period $T_{TCLK}$ includes the combined delays of flip-flops 510A–510D and test circuits 610A and 610B.

FIG. 7 is a schematic diagram of an oscillator 700 similar to oscillator 500 of FIG. 5, like-numbered elements being the same. Oscillator 700 also includes the same test circuits 610A and 610B as FIG. 6. Oscillator 700 is configured so that test-clock period $T_{TCLK}$ includes the fallingedge delay $D_F$ through flip-flops 510A–510D and test circuits 610A and 610B. The differences between oscillator 700 and oscillator 600 are the same as the differences between oscillator 500 and oscillator 200. A complete description of the operation of oscillator 700 is therefore omitted for brevity.

All of the circuits described in connection with FIGS. 2 through 7 can be implemented in programmable logic devices, such as one of the XC4000 series of FPGAs available from Xilinx, Inc., of San Jose, Calif. Devices, software, and methods used to accomplish general logic implementations are commercially available from Xilinx, Inc., and are well known to those of skill in the art. See, for example, "The Programmable Logic Data Book,"(1998) pp. 4–5 to 4–40, available from Xilinx, Inc., which are incorporated herein by reference.

While the present invention has been described in connection with specific embodiments, variations of these embodiments will be obvious to those of ordinary skill in the art. For example, the various examples include four synchronous components, but the invention is not so limited. Moreover, some components are shown directly connected to one another while others are shown connected via intermediate components. In each instance the method of interconnection establishes some desired electrical communication between two or more circuit nodes. Such communication may often be accomplished using a number of circuit configurations, as will be understood by those of skill in the art. Therefore, the spirit and scope of the appended claims should not be limited to the foregoing description.

What is claimed is:

1. An oscillator comprising a plurality of synchronous components connected into a loop, each synchronous component having:

a. a clock terminal;
   b. a synchronous input terminal;
   c. an asynchronous input terminal;
   d. an output terminal; and
   e. a node connecting the output terminal to the clock terminal of a downstream synchronous component and to the asynchronous terminal of an upstream synchronous component.

2. The oscillator of claim 1 further comprising a structure for initiating oscillation.

3. The oscillator of claim 2 wherein the structure for initiating oscillation comprises:
   a. an enable flip-flop having a clock terminal, a synchronous input terminal, an asynchronous input terminal, and an output terminal, the enable flip-flop receiving a test-enable signal on the synchronous input terminal; and
   b. a logic circuit receiving the test-enable signal, an output signal from the enable flip-flop output terminal, and a signal from a downstream synchronous component and applying a logic circuit output signal to the clock terminal of an upstream synchronous component.

4. The oscillator of claim 3 wherein the structure for initiating oscillation further comprises a node connecting the test-enable signal to the asynchronous input terminal of the enable flip-flop.

5. The oscillator of claim 3 wherein the logic circuit comprises:
   a. an AND gate receiving the test-enable signal and providing the logic circuit output signal to the clock terminal of the upstream synchronous component; and
   b. an OR gate receiving the signal from the downstream synchronous component and the complement of an output signal on the output terminal of the enable flip-flop and providing as an output signal an input signal to the AND gate.

6. The oscillator of claim 3 wherein the logic circuit comprises:
   a. a NAND gate receiving the test-enable signal and providing the logic circuit output signal to the clock terminal of the upstream synchronous component; and
   b. an OR gate receiving the complement of the signal from the downstream synchronous component and the complement of an output signal from the enable flip-flop and providing as an output signal an input signal to the NAND gate.

7. An oscillator comprising:
   a. a synchronous component having:
      i. a clock terminal,
      ii. a synchronous input terminal,
      iii. an asynchronous input terminal, and
      iv. an output terminal; and
   b. a delay element having
      i. an input terminal connected to the output terminal of the synchronous component; and
      ii. an output terminal coupled to the asynchronous input terminal of the synchronous component.

8. The oscillator of claim 7, wherein the synchronous component is a flip-flop.

9. The oscillator of claim 7, wherein the asynchronous input terminal is a clear terminal.

10. The oscillator of claim 7, wherein the asynchronous input terminal is a preset terminal.

11. The oscillator of claim 7, further comprising an asynchronous test circuit connected between the input terminal of the delay element and the output terminal of the synchronous component.

12. The oscillator of claim 7 wherein the synchronous component comprises an upstream synchronous component and the delay element comprises a downstream synchronous component, and the output terminal of the downstream synchronous component is connected through at least one further downstream synchronous component to the clock terminal of the upstream synchronous component.

13. A delay circuit comprising:
   a. a first synchronous component having:
      i. a first clock terminal;
      ii. an asynchronous input terminal; and
      iii. a first output terminal; and
   b. a second synchronous component having:
      i. a second clock terminal connected to the first output terminal; and
      ii. a second output terminal connected to the asynchronous input terminal of the first synchronous component.

14. The delay circuit of claim 13, wherein at least one of the first and second synchronous components comprises a flip-flop.

15. The delay circuit of claim 13, wherein the second output terminal is connected to the first clock terminal.

16. A system for determining a maximum signal propagation delay from an input node of a test circuit to an output node of the test circuit, the system comprising:
   a. a first synchronous component having:
      i. a first clock terminal;
      ii. an asynchronous input terminal; and
      iii. a first output terminal connected to the input node of the test circuit; and
   b. a second synchronous component having:
      i. a second clock terminal connected to the output node of the test circuit; and
      ii. a second output terminal connected to the asynchronous input terminal of the first synchronous component.

17. The system of claim 16, further comprising a counter including an input node connected to at least one of the first and second clock terminals.

18. A method for measuring a signal propagation delay period from an input node of a test circuit to an output node of the test circuit, the method comprising:
   a. providing a first synchronous signal transition on the input node of the test circuit, the first synchronous signal transition changing the input node from a first logic level to a second logic level;
   b. receiving an output signal transition on the output node of the test circuit in response to the signal transition on the input node, wherein the output signal transition is delayed by the signal propagation delay period;
   c. generating, in response to the output signal,
      i. an asynchronous signal transition on the input node of the test circuit to return the input node to the first logic level; and
      ii. a second synchronous signal transition on the input node of the test circuit to generate, after the signal propagation delay period, a second output signal transition; and
   d. measuring the period between successive synchronous signal transitions on the input node of the test circuit.

19. The method of claim 18, wherein the signal transition is a rising edge of a logic signal.

20. The method of claim 18, wherein the signal transition is a falling edge of a logic signal.

21. A circuit configuration for measuring a signal propagation delay period from an input node of a test circuit to an output node of the test circuit, the circuit configuration comprising:
   a. means for providing a first synchronous signal transition on the input node of the test circuit, the first synchronous signal transition changing the input node from a first logic level to a second logic level;

b. means for receiving an output signal transition on the output node of the test circuit in response to the signal transition on the input node, wherein the output signal transition is delayed by the signal propagation delay period;

c. means for generating, in response to the output signal,
   i. an asynchronous signal transition on the input node of the test circuit to return the input node to the first logic level; and
   ii. a second synchronous signal transition on the input node of the test circuit to generate, after the signal propagation delay period, a second output signal transition; and d. means for measuring the period between successive synchronous signal transitions on the input node of the test circuit.

* * * * *